(12) United States Patent
Kenworthy

(10) Patent No.: US 10,985,078 B2
(45) Date of Patent: Apr. 20, 2021

(54) SENSOR AND ADJUSTER FOR A CONSUMABLE

(71) Applicant: Lam Research Corporation, Fremont, CA (US)

(72) Inventor: Ian Kenworthy, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 626 days.

(21) Appl. No.: 14/934,624

(22) Filed: Nov. 6, 2015

(65) Prior Publication Data
US 2017/0133283 A1 May 11, 2017

(51) Int. Cl.
| | |
|---|---|
| *H01L 21/66* | (2006.01) |
| *H01L 21/683* | (2006.01) |
| *H01L 21/67* | (2006.01) |
| *H01L 21/687* | (2006.01) |
| *G05B 15/02* | (2006.01) |
| *H01L 21/3065* | (2006.01) |
| *H01J 37/32* | (2006.01) |

(52) U.S. Cl.
CPC .............. *H01L 22/20* (2013.01); *G05B 15/02* (2013.01); *H01J 37/3288* (2013.01); *H01J 37/3299* (2013.01); *H01J 37/32458* (2013.01); *H01J 37/32642* (2013.01); *H01J 37/32715* (2013.01); *H01J 37/32752* (2013.01); *H01J 37/32807* (2013.01); *H01J 37/32908* (2013.01); *H01L 21/3065* (2013.01); *H01L 21/67069* (2013.01); *H01L 21/67253* (2013.01); *H01L 21/6831* (2013.01); *H01L 21/6833* (2013.01); *H01L 21/68735* (2013.01); *H01J 2237/20264* (2013.01); *H01J 2237/24564* (2013.01); *H01J 2237/334* (2013.01)

(58) Field of Classification Search
CPC ......... H01L 21/68721; H01L 21/31116; H01L 21/67253; H01L 21/32136; H01L 21/68785; H01L 21/3065; H01L 21/67069
See application file for complete search history.

(56) References Cited

U.S. PATENT DOCUMENTS

| | | | | |
|---|---|---|---|---|
| 6,437,489 B1 * | 8/2002 | Shinke | ................ | H01L 41/0475 310/367 |
| 2002/0072240 A1 * | 6/2002 | Koike | ................ | H01J 7/32642 438/710 |
| 2003/0027498 A1 * | 2/2003 | Tseng | ...................... | B24B 37/32 451/41 |
| 2004/0163478 A1 * | 8/2004 | Xu | ........................ | B06B 1/0622 73/763 |
| 2006/0216406 A1 * | 9/2006 | Hudson | ............. | H01J 37/32935 427/8 |
| 2007/0111339 A1 * | 5/2007 | Wege | ................ | H01L 21/67069 438/10 |
| 2010/0139374 A1 * | 6/2010 | Dermody | ................ | C40B 60/12 73/54.02 |

FOREIGN PATENT DOCUMENTS

CN 102965632 A * 3/2013

OTHER PUBLICATIONS

Chinese Office Action from Chinese Application No. 201610156777.6 dated Nov. 2, 2018.

* cited by examiner

Primary Examiner — Parvi Hassanzadeh
Assistant Examiner — Margaret D Klunk

(57) ABSTRACT

An apparatus for use in a processing chamber is provided. A consumable is within the processing chamber. A scale is positioned to measure a mass of the consumable.

7 Claims, 6 Drawing Sheets

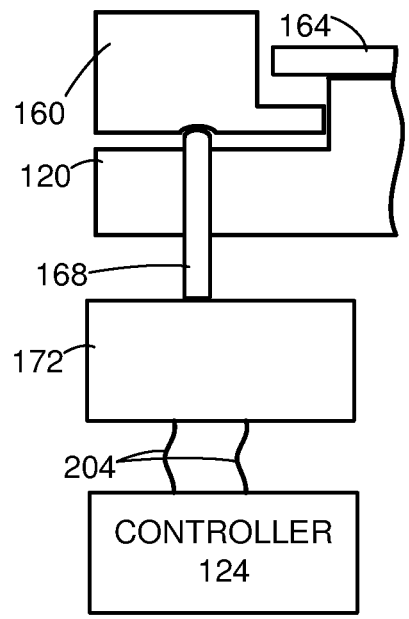 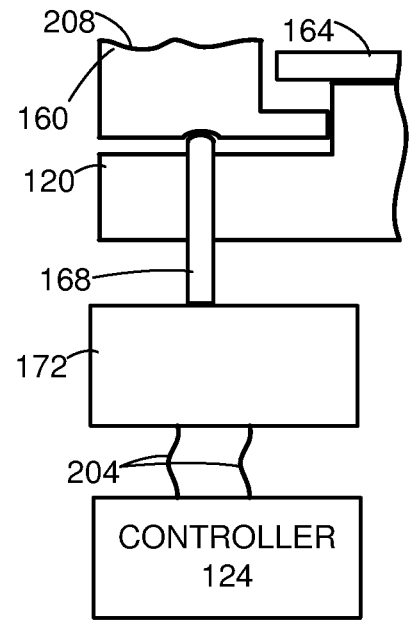
FIG. 2A  FIG. 2B
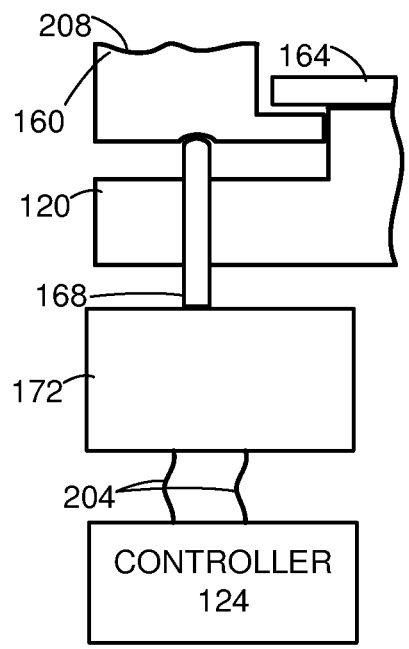
FIG. 2C

SENSOR AND ADJUSTER FOR A CONSUMABLE

BACKGROUND

This disclosure relates to the manufacturing of semiconductor devices. More specifically, the disclosure relates to the manufacturing of semiconductor devices in a processing chamber with consumable parts.

In the manufacture of semiconductor devices, the semiconductor may be processed in a processing chamber. Some processing chambers have consumable parts. For example an etch chamber may have a consumable edge ring, which is etched over time. Other processing chambers may have consumables over which layers are deposited over time.

SUMMARY

Disclosed herein are various embodiments, including a manifestation in which an apparatus, for use in a processing chamber is provided. A consumable is within the processing chamber. A scale is positioned to measure a mass of the consumable.

In another manifestation, a method comprising is provided. A mass of at least one consumable in a process chamber is measured. The process chamber is used. A change of mass of the at least one consumable is measured. The at least one consumable is conditioned according to the measured change of mass of the at least one consumable.

In another manifestation, an apparatus is provided. A plasma processing chamber is provided. A consumable is provided within the processing chamber. A piezo transducer is positioned to measure a mass of the consumable and act as an actuator for moving the consumable. A controller is electrically connected to the piezo transducer, wherein the controller comprises at least one CPU and computer readable media electrically connected to the at least one CPU. The computer readable media, comprises computer readable code for measuring a voltage or current from the piezo transducer, computer readable code for determining an applied voltage or current from the measured voltage or current, and computer readable code for applying the determined applied voltage or current across the piezo transducer, wherein the applied determined applied voltage or current moves the consumable within the processing chamber.

These and other features will be described in more detail below in the detailed description and in conjunction with the following figures.

BRIEF DESCRIPTION OF THE DRAWINGS

The disclosed inventions are illustrated by way of example, and not by way of limitation, in the figures of the accompanying drawings and in which like reference numerals refer to similar elements and in which:

FIGS. 2A-C are enlarged schematic views of a cross-section of part of an edge ring, substrate, electrode, scale, and scale rod.

DETAILED DESCRIPTION

Embodiments will now be described in detail with reference to a few of the embodiments thereof as illustrated in the accompanying drawings. In the following description, specific details are set forth in order to provide a thorough understanding of the present invention. However, the present disclosure may be practiced without some or all of these specific details, and the disclosure encompasses modifications which may be made in accordance with the knowledge generally available within this field of technology. Well-known process steps and/or structures have not been described in detail in order to not unnecessarily obscure the present disclosure.

Figure 1:
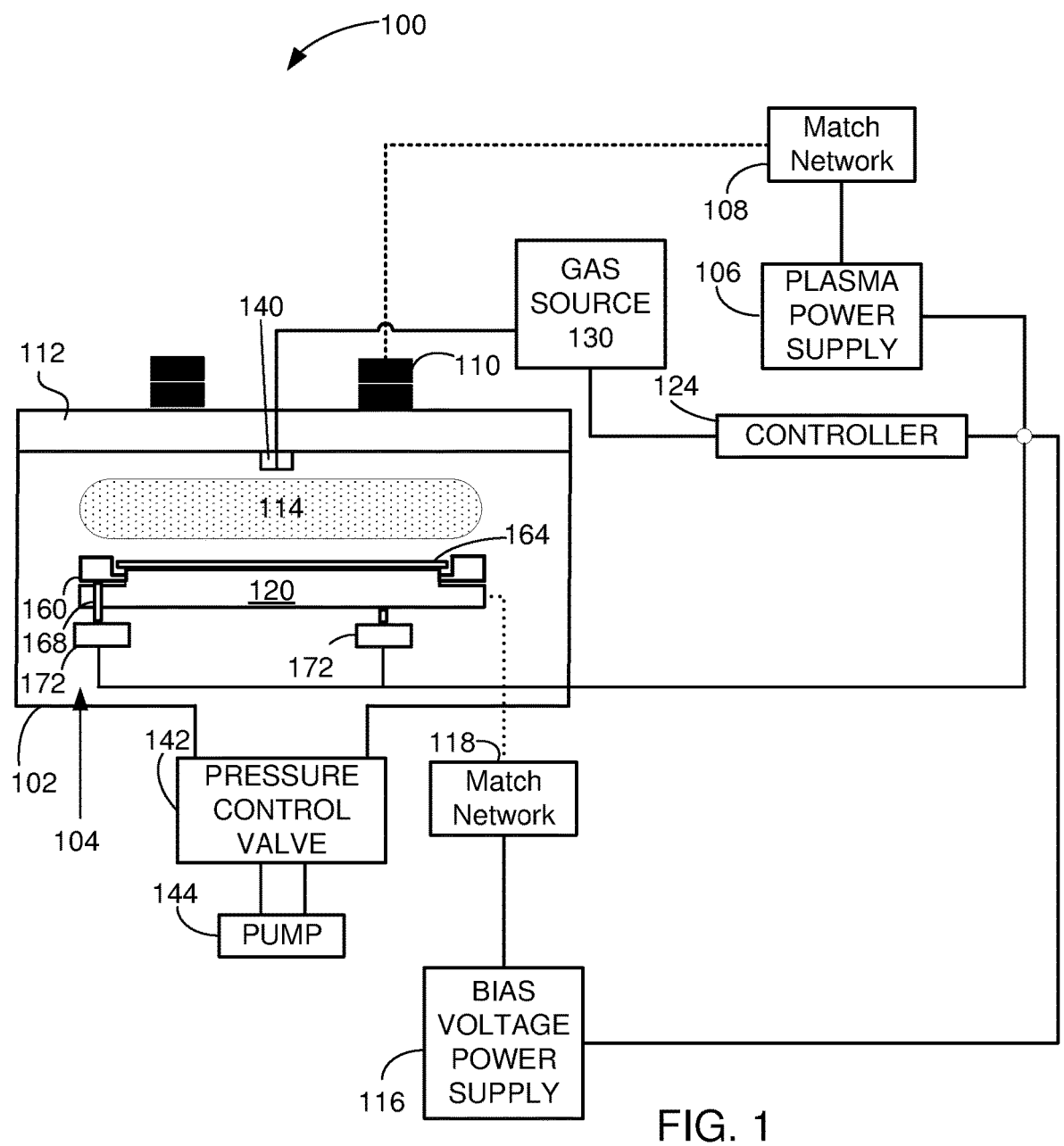
FIG. 1 schematically illustrates a cross-sectional view of an example of a plasma processing chamber, which may be used in an embodiment.

To facilitate understanding, FIG. 1 schematically illustrates a cross-sectional view of an example of a plasma processing chamber 100 which may be used in an embodiment. The plasma processing chamber 100 includes a plasma reactor 102 having a plasma processing confinement chamber 104 therein. A plasma power supply 106, tuned by a match network 108, supplies power to a TCP coil 110 located near a power window 112 to create a plasma 114 in the plasma processing confinement chamber 104 by providing an inductively coupled power. The TCP coil (upper power source) 110 may be configured to produce a uniform diffusion profile within the plasma processing confinement chamber 104. For example, the TCP coil 110 may be configured to generate a toroidal power distribution in the plasma 114. The power window 112 is provided to separate the TCP coil 110 from the plasma processing confinement chamber 104 while allowing energy to pass from the TCP coil 110 to the plasma processing confinement chamber 104. A wafer bias voltage power supply 116 tuned by a match network 118 provides power to an electrode 120 to set the bias voltage on the substrate 164 which is supported by the electrode 120.

The plasma power supply 106 and the wafer bias voltage power supply 116 may be configured to operate at specific radio frequencies such as, for example, 13.56 MHz, 27 MHz, 2 MHz, 60 MHz, 400 kHz, 2.54 GHz, or combinations thereof. Plasma power supply 106 and wafer bias voltage power supply 116 may be appropriately sized to supply a range of powers in order to achieve desired process performance. For example, in one embodiment of the present invention, the plasma power supply 106 may supply the power in a range of 50 to 5000 Watts, and the wafer bias voltage power supply 116 may supply a bias voltage of in a range of 20 to 2000 V. In addition, the TCP coil 110 and/or the electrode 120 may be comprised of two or more sub-coils or sub-electrodes, which may be powered by a single power supply or powered by multiple power supplies.

As shown in FIG. 1, the plasma processing chamber 100 further includes a gas source/gas supply mechanism 130. The gas source 130 is in fluid connection with plasma processing confinement chamber 104 through a gas inlet, such as a gas injector 140. The gas injector 140 may be located in any advantageous location in the plasma processing confinement chamber 104, and may take any form for injecting gas. Preferably, however, the gas inlet may be configured to produce a "tunable" gas injection profile, which allows independent adjustment of the respective flow of the gases to multiple zones in the plasma process confinement chamber 104. The process gases and byproducts are removed from the plasma process confinement chamber 104 via a pressure control valve 142 and a pump 144, which also serve to maintain a particular pressure within the plasma processing confinement chamber 104. The pressure control valve 142 can maintain a pressure of less than 1 Torr during processing. An edge ring 160 is placed around the wafer 164. A Kiyo by Lam Research Corp. of Fremont, Calif., may be used to practice an embodiment. In this embodiment, scales 172 are placed below the edge ring 160. Scale rods 168 are placed between the scales 172 and the edge ring 160. A controller 124 is controllably connected to the gas source 130, plasma power supply 106, the bias voltage power supply 116 and the scales 172.

FIG. 2A is an enlarged schematic view of a cross-section of part of the edge ring 160, substrate 164, electrode 120, scale 172, and scale rod 168. In this embodiment, the scale 172 is a piezo transducer, which is electrically connected to the controller 124 with a wireless connection or at least one wire 204 connected between the scale 172 and the controller 124. In this example, in order to cause movement of the edge ring, the controller 124 applies a voltage across the wires 204 to the scale 172. The voltage applied to or electric charge across the scale 172 causes the scale 172 to apply a force against the scale rod and therefore against the edge ring 160. When that force is greater than the weight of the edge ring 160, the edge ring will move up. When the force is equal, the edge ring remains stationary/suspended. When used as a scale, the system is reversed. The controller 124 takes in the electric signal from the scale 172 which is proportional to the new weight of the edge ring 160. Therefore, the piezo transducer acts as both a scale 172 to weigh at least part of the edge ring 160 and an actuator to move the at least part of the edge ring 160.

Figure 3:
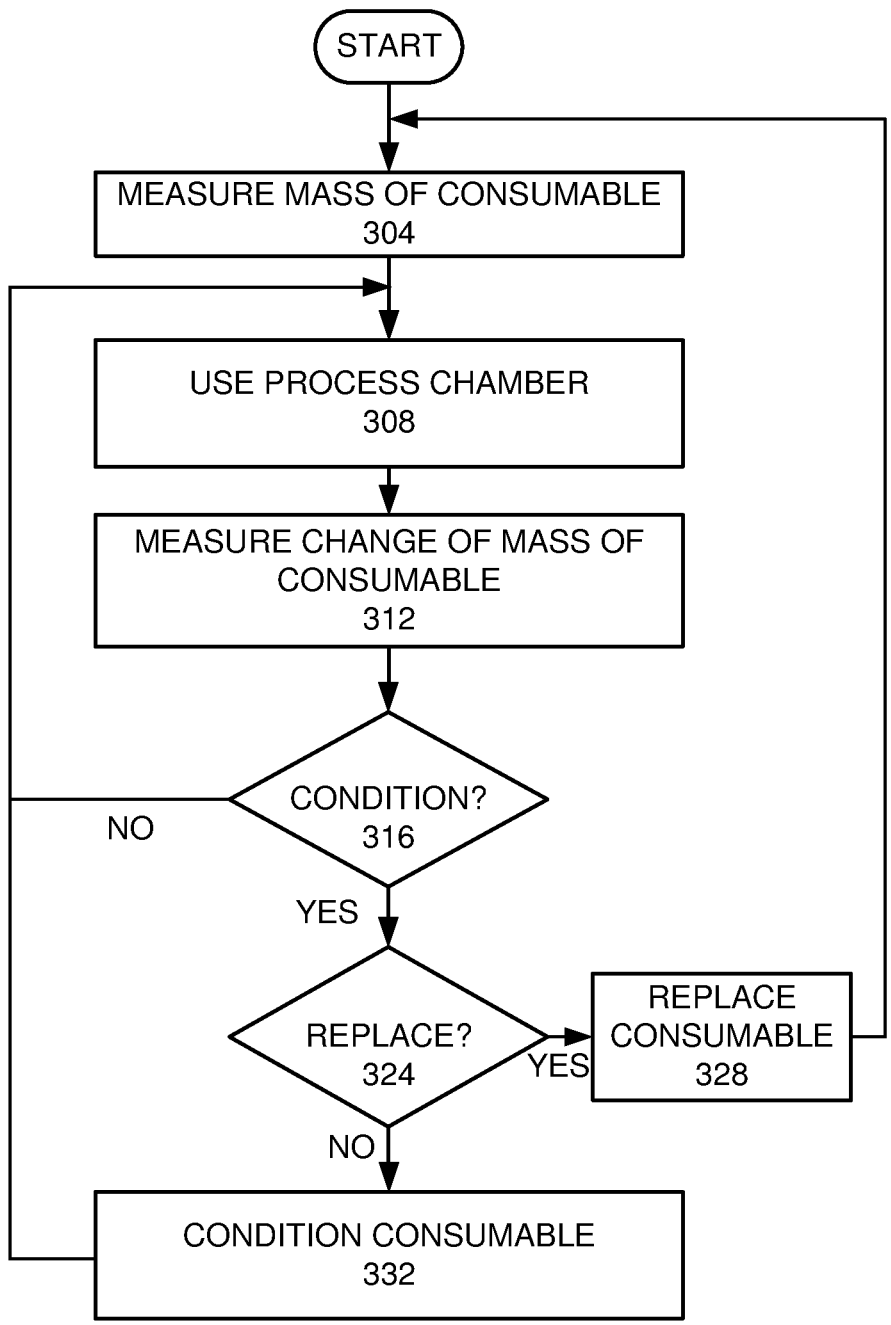
FIG. 3 is a high level flow chart of an embodiment.

FIG. 3 is a high level flow chart of an embodiment. The scale is used to measure the mass of the consumable (step 304). In this example, the plasma processing confinement chamber 104 is used for etching. As a result, the edge ring 160 is a consumable, which is etched away and must be periodically replaced. The process chamber is used (step 308). In this example, the etch chamber is used to etch a substrate. The change of the mass of the consumable is measured (step 312). In this example, the top of the edge ring 160 is etched away. FIG. 2B is an enlarged cross-sectional view of part of the edge ring 160 after part of the top of the edge ring 160 has been etched away, leaving an irregular top surface 208. The etching away of part of the top of the edge ring 160 causes a change in the mass of the edge ring 160, which chances the force on the scale rod 168, which changes the force applied by the scale rode 168 to the scale 172. The change in force allows the scale 172 to measure the change in weight or mass of the edge ring 160.

The controller 124 uses the measured change of mass to determine whether or not the consumable needs to be conditioned (step 316). If conditioning is not needed, the procedure returns to the step of using the process chamber (step 308), and the procedure is continued. If conditioning is needed, then the controller 124 may determine if the consumable needs to be replaced (step 324). If the controller 124 determines that the consumable is to be replaced, the etch ring 160 is removed and a new etch ring is provided (step 328). The process is then returned to step 304 where the mass of the new etch ring is measured (step 304). The controller 124 may determine that an etch ring should be replaced when the mass of the edge ring falls below a threshold mass. If the controller 124 determines not to replace the etch ring 160, then the consumable is conditioned (step 332). In this example, the conditioning of the etch ring 160 is accomplished by moving the edge ring 160.

FIG. 2C is an enlarged cross-sectional view of part of the edge ring 160 after part has been conditioned. In this example, a higher applied voltage by the controller 124 through the wires 204 increases the electric charge across the scale 172, which is a piezo transducer. The piezo transducer increases the force applied to the scale rod 168, which raises the edge ring 160. The procedure returns to the step of using the process chamber (step 308), and the procedure is continued.

Edge rings surround the electrode, which may be a ceramic electrostatic chuck (ESC) and create a specially tuned "pocket" under, around and extending above the wafer surface. The tuning of the pocket is done through careful selection of edge ring diameters, heights, steps, radii and angles among other parameters. Edge rings are consumable items and are eroded and deformed by the plasma. Eventually the edge ring becomes so worn down that it's no longer properly tuned. At that point the chamber's process results fall out of spec and the edge ring needs to be replaced. Replacing an edge ring requires opening the chamber which is very disruptive to customer productivity.

This embodiment provides a system that can adjust the edge ring in-situ to compensate for the wear. There are two portions to that system. One part must be able to detect how much the edge ring has worn down. The other part must be able to adjust the edge ring according to how much it is worn down. This embodiment provides a way to accomplish the movement and sensing in one compact unit.

In this example, piezoelectric transducers are used to do both the movement and sensing. Piezoelectric actuators are electrical to mechanical transducers. They take in an electric signal and transform that into very fine, very small, very precise mechanical motion. This motion is produced by a force the actuator imparts. This design then "reverses" the actuator and, instead of taking in electric current/voltage and outputting a force, takes in a force and outputs an electric current/voltage. The force is the weight of the edge ring which creates a current/voltage proportional to that weight. A change in current/voltage would be a change in weight. The change in weight would be calibrated to edge ring wear, and this system would know how much to move the edge ring based on that reading.

The edge ring, if a single piece, would be moved vertically by two or more (likely 3 or 4) piezoelectric transducers. From below the edge ring the transducers would push up on the ring to move it and measure its change in weight to analyze its wear.

Such a system provides an improvement over systems that use lasers and mirrors for measuring the etching of the edge ring. Systems that use lasers and mirrors are bulky and are not ideal for incorporation in process chambers. Such systems also require a way for the laser signal to get in and out of the chamber. This requires another window and seal in sensitive locations.

The above example further provides an improvement over a laser and mirror system, where the above example solves the problems by saving space, requiring fewer vacuum feedthroughs, and not conflicting with existing process chamber hardware. The above embodiment resolves several packaging, thermal and RF signal issues by making use of existing hardware and the piezoelectric actuators, to also do the analysis of the edge ring condition.

A preferred implementation uses a piezoelectric transducer that imparts force to adjust the edge ring position and also senses weight changes to determine the amount of adjustment that is required. One alternative design would be to use pneumatic transducers. The pneumatic transducer would convert a pressure to a force in order to move the edge ring. Then the actuator would switch to sense the edge ring's change in weight and output a pressure which would tell the tool how much to adjust the edge ring's position.

Figure 4:
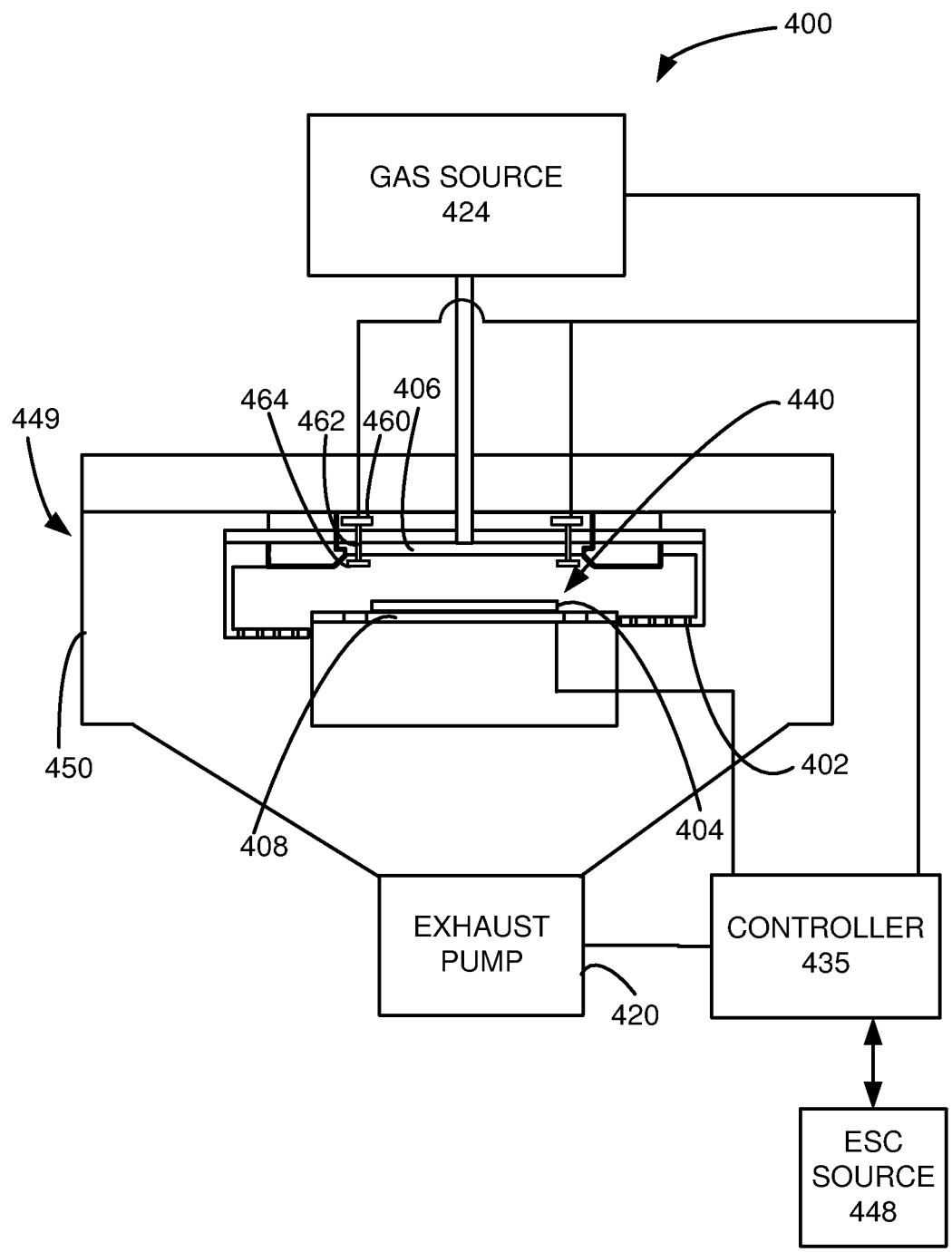
FIG. 4 is a cross-sectional view of a process chamber used in another embodiment.

FIG. 4 is a cross-sectional view of a process chamber is another embodiment. An etch reactor 400 comprises a gas distribution plate 406 providing a gas inlet and a chuck 408, within an etch chamber 449, enclosed by a chamber wall 450. Within the etch chamber 449, a substrate 404 on which the stack is formed is positioned on top of the chuck 408. The chuck 408 may provide a bias from the ESC source 448 as an electrostatic chuck (ESC) for holding the substrate 404 or may use another chucking force to hold the substrate 404. A gas source 424 is connected to the etch chamber 449 through the distribution plate 406. A plasma confinement shroud, which in this embodiment is a C-shroud 402, surrounds the plasma volume. In this example, the plasma is generated using capacitive coupling. A Flex by Lam Research Corp. of Fremont, Calif. is an example of such a system. In this example, a plurality of scales 460 is provided above the gas distribution plate 406. Each scale of the plurality of scales 460 is attached to a hanger of a plurality of hangers 462. Each of the plurality of hangers is connected to a processing ring 464. In this example, the scales 460 may comprise piezo transducers, which are electrically connected to the controller.

Figure 5:
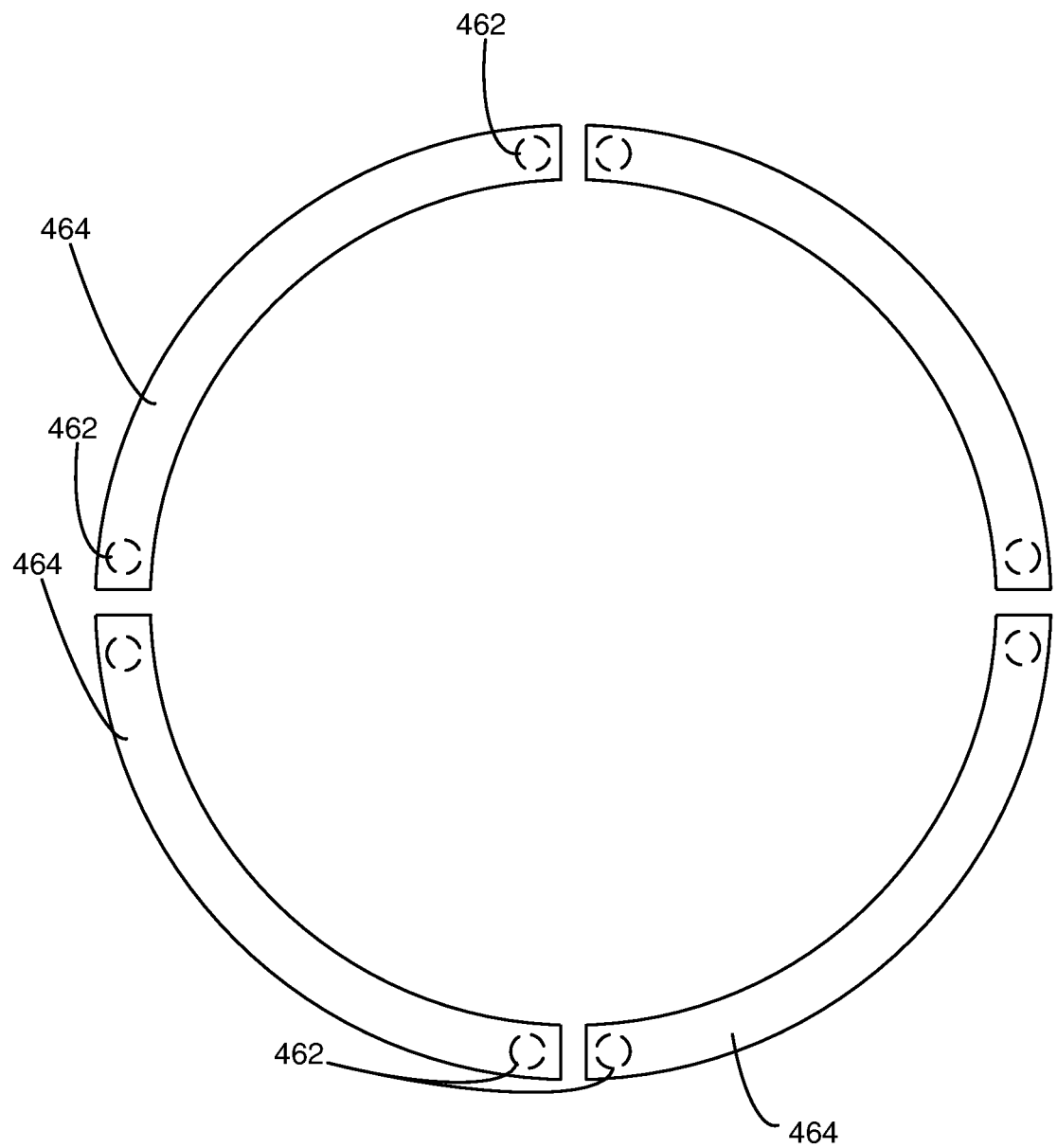
FIG. 5 is an enlarged bottom view of a processing ring.

FIG. 5 is an enlarged bottom view of the processing ring 464. In this example, the processing ring 464 is segmented into four segments. Each segment is connected to two hangers of the plurality of hangers 462. In this example, instead of using compression to measure the mass of the processing ring 464, tension on the plurality of hangars 462 is used to measure mass of the processing ring 464. In addition, instead of measuring the mass of the entire processing ring 464, the mass of each segment may instead be used. In this embodiment, deposition may be formed on the processing ring 464. Therefore, in this embodiment the processing ring may be conditioned by subjecting the processing ring to a deposition removal step as part of the conditioning of the consumable. In the same or another embodiment, the segments of the processing ring 464 may be raised or lowered as part of the conditioning of the consumable (step 332). In such a movement, the mass of a segment may cause the raising or lowering of that segment. In another example, the mass of one segment may cause the raising or lowering another segment. In such an embodiment, the mass of one segment may be used to determine compensation needed for region of the chamber around another segment.

Figure 6:
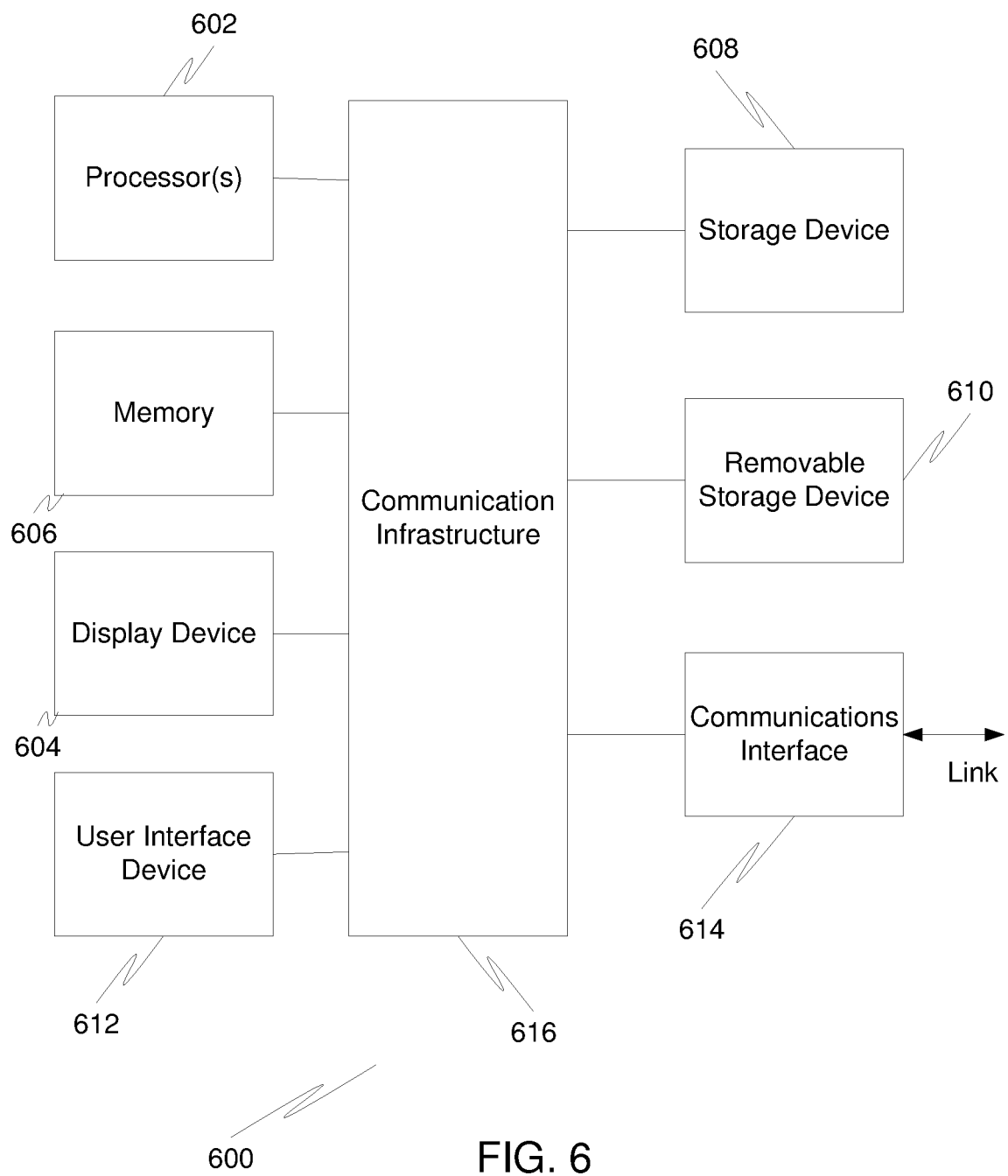
FIG. 6 is a high level block diagram showing a computer system, which is suitable for implementing a controller.

FIG. 6 is a high level block diagram showing a computer system 600, which is suitable for implementing a controller 435 used in embodiments. The computer system may have many physical forms ranging from an integrated circuit, a printed circuit board, and a small handheld device up to a huge super computer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) to which the aforementioned devices/modules are connected.

Information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In an embodiment, computer readable code in the storage device 608 allows the piezo transducer to function as a scale. Such software may first measure a voltage or electric charge across the piezo transducer. Then such software would correlate the measured voltage or electric charge with mass. Such a correlation may be expressed as a function or may be provided by a lookup table. Then the correlated mass would be provided. Computer readable code in the storage device 608 may also allow the piezo transducer to act as an actuator. Such software may use the correlated mass to determine a desired force or displacement that is to be applied to the processing ring 464. Then the software would find a voltage or electric charge that is related to the desired force or displacement. The software would then apply the found voltage or electric charge across the piezo transducer.

In another embodiment, software for the scale and actuator may be further integrated by using the measured voltage or electric charge to determine the applied voltage or charge for a desired displacement and to determine if a consumable must be removed. Such an embodiment would still have scale and actuator, however a tighter integration is used, so that mass is not calculated, but the voltage indicating mass is used to determine whether actuation or replacement is needed. The use of voltage or electric charge as a mass indicator, may not determine the final mass, but would use the mass indicator to determine an action, where such an action is based on change of mass, which is reflected in change of voltage or change of electric charge and then reflects a change in consumable position.

By using a transducer to be both a scale and actuator reduces the footprint of the apparatus needed to perform these two functions. In different embodiment the change in mass may be measured after different numbers of uses of the chamber. For example, the mass may be measured after each wafer is processed or the mass may be measure after 100 wafers are processed. In the above embodiments, the scales are provided by the piezo transducer with the associated electronics, such as the controller with software that allows for the measurement of mass. Without the proper software, the piezo transducer cannot be used to measure mass, which then means that such a piezo transducer is not a scale. Such a change in voltage or charge would then be used to determine a voltage or charge that should be applied for a desired actuation.

While inventions have been described in terms of several preferred embodiments, there are alterations, permutations, and various substitute equivalents, which fall within the scope of this invention. There are many alternative ways of implementing the methods and apparatuses disclosed herein. It is therefore intended that the following appended claims be interpreted as including all such alterations, permutations, and various substitute equivalents as fall within the true spirit and scope of the present invention.

What is claimed is:

1. An apparatus, for use in a processing chamber, comprising:
    an edge ring within the processing chamber; and
    a piezo transducer, wherein the piezo transducer is configured to act as a scale positioned to measure a mass of the edge ring and an actuator arranged to raise and lower the edge ring based on the mass as measured by the scale, wherein the piezo transducer outputs a measured current or voltage indicative of the mass of the edge ring, and wherein an applied current or voltage input to the piezo transducer causes movement of the actuator to raise and lower the edge ring.

2. The apparatus, as recited in claim 1, further comprising a controller electrically connected to the scale.

3. The apparatus, as recited in claim 2, further comprising:
    a controller electrically connected to the piezo transducer, wherein the controller comprises:
        at least one CPU; and
        non-transitory computer readable media electrically connected to the at least one CPU, wherein the computer readable media, comprises:
            non-transitory computer readable code for measuring a voltage or current from the piezo transducer;
            non-transitory computer readable code for determining an applied voltage or current from the measured voltage or current; and
            non-transitory computer readable code for applying the determined applied voltage or current across the piezo transducer, to raise and lower the edge ring within the processing chamber.

4. The apparatus, as recited in claim 1, wherein the processing chamber is a plasma processing chamber.

5. The apparatus, as recited in claim 1, wherein the scale further comprises tangible computer readable media, comprising:
    computer readable code for measuring a voltage from the piezo transducer; and
    computer readable code for using the measured voltage as a mass indicator.

6. The apparatus, as recited in claim 5, wherein the actuator further comprises tangible computer readable media, comprising:
    computer readable code for determining an applied voltage; and
    computer readable code for applying the determined applied voltage across the piezo transducer.

7. An apparatus, comprising:
    a plasma processing chamber;
    an edge ring within the processing chamber;
    a piezo transducer positioned to measure a mass of the edge ring and act as an actuator for moving the edge ring;
    a controller electrically connected to the piezo transducer, wherein the controller comprises:
        at least one CPU; and
        non-transitory computer readable media electrically connected to the at least one CPU, wherein the computer readable media, comprises:
            non-transitory computer readable code for measuring a voltage or current from the piezo transducer;
            non-transitory computer readable code for determining an applied voltage or current from the measured voltage or current; and
            non-transitory computer readable code for applying the determined applied voltage or current across the piezo transducer to raise and lower the edge ring within the processing chamber.

* * * * *